(12) United States Patent
Yamamura

(10) Patent No.: US 11,556,114 B2
(45) Date of Patent: Jan. 17, 2023

(54) DRAWING APPARATUS AND DRAWING METHOD

(71) Applicant: NuFlare Technology, Inc., Yokohama (JP)

(72) Inventor: Hikaru Yamamura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 344 days.

(21) Appl. No.: 16/788,359

(22) Filed: Feb. 12, 2020

(65) Prior Publication Data

US 2020/0264588 A1  Aug. 20, 2020

(30) Foreign Application Priority Data

Feb. 14, 2019 (JP) .............................. JP2019-024764

(51) Int. Cl.
  *G01R 27/18* (2006.01)
  *G05B 19/418* (2006.01)
  (Continued)

(52) U.S. Cl.
  CPC ......... *G05B 19/4184* (2013.01); *G01R 27/18* (2013.01); *G03F 9/00* (2013.01);
  (Continued)

(58) Field of Classification Search
  CPC ......... G01R 27/18; G01R 27/205; G03F 9/00; G03F 9/7088; G05B 19/4184;
  (Continued)

(56) References Cited

U.S. PATENT DOCUMENTS 8,488,429 B2 * 7/2013 Izawa .................... G11B 7/261
                                                        369/53.18
2009/0005998 A1 * 1/2009 Orishimo ................ G03F 7/709
                                                        702/15
(Continued)

FOREIGN PATENT DOCUMENTS

JP         2010-163284 A     7/2010
JP         2012-208140 A    10/2012
            (Continued)

*Primary Examiner* — Deoram Persaud
(74) *Attorney, Agent, or Firm* — Oblon, McClelland, Maier & Neustadt, L.L.P.

(57) ABSTRACT

A drawing apparatus according to the embodiment includes a chamber configured to house a processing target; a drawing part configured to draw a predetermined pattern on the processing target with a charged particle beam; a resistance measuring part configured to measure a resistance value of the processing target via a grounding member grounding the processing target in the chamber; a receiver configured to receive earthquake information; a controller configured to stop a drawing process in the chamber when the receiver receives the earthquake information; and an arithmetic processor configured to determine whether the processing target is grounded on a basis of the resistance value from the resistance measuring part, wherein the controller resumes the drawing process when the arithmetic processor determines that the processing target is grounded after the drawing process is stopped.

17 Claims, 12 Drawing Sheets

(51) Int. Cl.
*G03F 9/00* (2006.01)
*H01J 37/02* (2006.01)

(52) U.S. Cl.
CPC .......... *G03F 9/7088* (2013.01); *H01J 37/026* (2013.01); *G05B 2219/34465* (2013.01); *G05B 2219/37097* (2013.01); *H01J 2237/0203* (2013.01)

(58) Field of Classification Search
CPC . G05B 2219/34465; G05B 2219/37097; H01J 2237/0203; H01J 2237/0216; H01J 2237/30438; H01J 2237/31793; H01J 37/3174; H01J 37/026
See application file for complete search history.

(56) References Cited

U.S. PATENT DOCUMENTS

| | | | |
|---|---|---|---|
| 2012/0250479 A1 | 10/2012 | Izawa | |
| 2014/0001380 A1* | 1/2014 | Ohnishi | H01J 37/20 250/492.3 |
| 2018/0342371 A1* | 11/2018 | Isaji | H01J 37/3174 |
| 2020/0072777 A1* | 3/2020 | Kan | G01N 27/041 |

FOREIGN PATENT DOCUMENTS

| | | |
|---|---|---|
| JP | 2013-38397 A | 2/2013 |
| JP | 2016-1761 A | 1/2016 |

\* cited by examiner

DRAWING APPARATUS AND DRAWING METHOD

CROSS REFERENCE TO RELATED APPLICATIONS

This application is based upon and claims the benefit of priority from the prior Japanese Patent Application No. 2019-024764, filed on Feb. 14, 2019, the entire contents of which are incorporated herein by reference.

FIELD

The embodiments of the present invention relate to a drawing apparatus and a drawing method.

BACKGROUND

Mask drawing apparatuses are apparatuses that draw a desired pattern by irradiating plates (mask blanks) with a charged particle beam. Some of the mask drawing apparatuses have an emergency quake stop (hereinafter, EQS) function using an earthquake early warning, and temporarily bring drawing processing into a stopped state (hereinafter, also "emergency suspended state") at the time of an earthquake.

Returning from this emergency suspended state is performed after the state of the mask drawing apparatus is manually confirmed. The mask drawing apparatus is alternatively set to be automatically returned a predetermined time after receiving an emergency suspension instruction.

However, because a writing chamber (W chamber) that performs drawing is kept in a high vacuum state, the inner part thereof cannot be visually checked. Therefore, an operator cannot directly check whether the plate is greatly displaced from a stage or grounding eaves are displaced from the plate. If the drawing processing is continued in such a condition, there are cases where the drawing accuracy decreases or the plate is charged with charged particles without being grounded. If the plate is displaced from the stage, the plate has a risk of colliding with the inner wall of the W chamber. There is also a risk that the mask drawing apparatus is broken due to discharging from the plate if the plate is charged.

SUMMARY

A drawing apparatus according to the embodiment includes a chamber configured to house a processing target; a drawing part configured to draw a predetermined pattern on the processing target with a charged particle beam; a resistance measuring part configured to measure a resistance value of the processing target via a grounding member grounding the processing target in the chamber; a receiver configured to receive earthquake information; a controller configured to stop a drawing process in the chamber when the receiver receives the earthquake information; and an arithmetic processor configured to determine whether the processing target is grounded on a basis of the resistance value from the resistance measuring part, wherein the controller resumes the drawing process when the arithmetic processor determines that the processing target is grounded after the drawing process is stopped.

A drawing method using a drawing apparatus comprising a drawing part configured to draw a predetermined pattern on a processing target with a charged particle beam, a resistance measuring part configured to measure a resistance value of the processing target via a grounding member grounding the processing target, a receiver configured to receive earthquake information, a controller configured to control a drawing process of the processing target, and an arithmetic processor configured to determine whether the processing target is grounded, the method according to the embodiment includes stopping the drawing process when the earthquake information is received during the drawing process; measuring a resistance value of the processing target after the drawing process is stopped; determining whether the processing target is grounded on a basis of the resistance value; and resuming the drawing process by the controller when it is determined that the processing target is grounded.

DETAILED DESCRIPTION

Figure 1A:
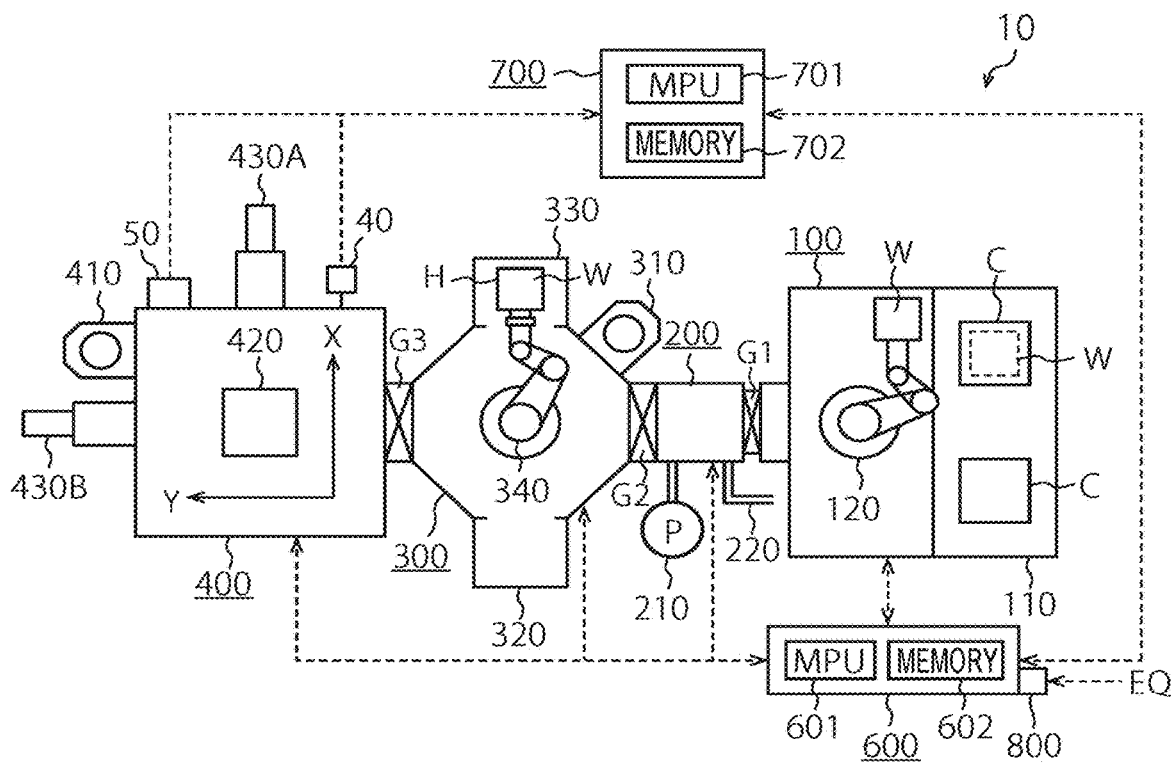
FIGS. 1A and 1B are schematic diagrams of a charged particle beam drawing apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

First Embodiment

Figure 1B:
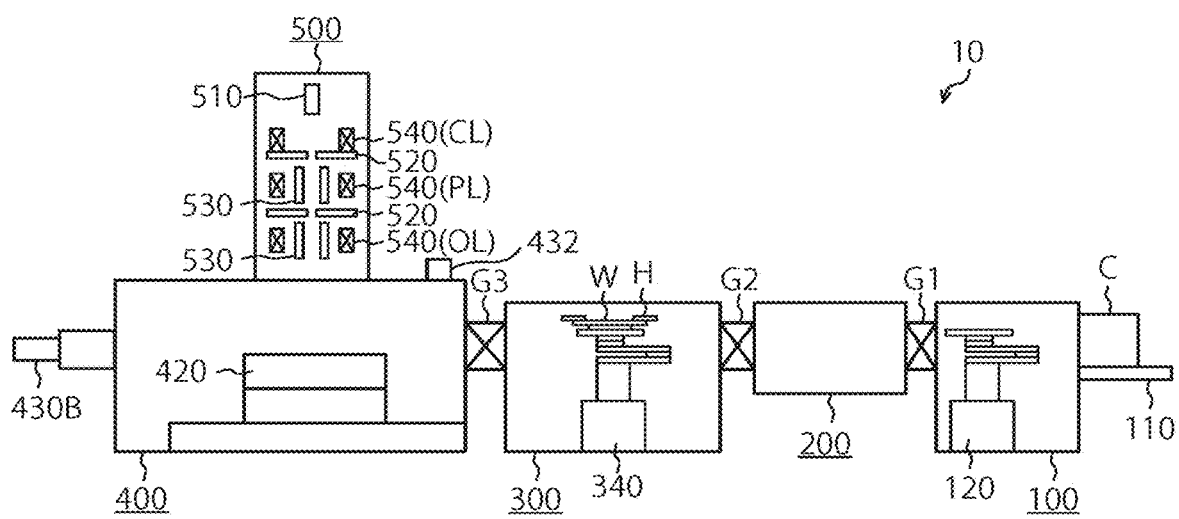

FIGS. 1A and 1B are schematic diagrams of a charged particle beam drawing apparatus (hereinafter, also simply "drawing apparatus") 10 according to a first embodiment. FIG. 1A is a horizontal sectional schematic diagram of the drawing apparatus 10. FIG. 1B is a vertical sectional schematic diagram of the drawing apparatus 10. A configuration of the drawing apparatus 10 is explained below with reference to FIGS. 1A and 1B. Although not particularly limited, the charged particle beam is, for example, an electron beam or an ion beam. In the following embodiments, an electron beam is used as an example of the charged particle beam.

As illustrated in FIG. 1A, the drawing apparatus 10 includes an interface (I/F) 100, a carry-in/out (I/O) chamber 200, a robot chamber (R chamber) 300, a writing chamber (W chamber) 400, an electron beam column 500, a control mechanism 600, an arithmetic processor 700, a receiver 800, and gate valves G1 to G3. Dashed lines in FIG. 1A indicate flows of a control signal, data, and the like.

The I/F 100 includes a mounting table 110 on which a container C (a SMIFPod, for example) housing a mask substrate (plate) W is mounted, and a transfer robot 120 that transfers the mask substrate W.

The I/O chamber 200 is a so-called load lock chamber for carrying in/out the mask substrate W while maintaining the inside of the R chamber 300 in a vacuum (low pressure) state. The gate valve G1 is provided between the I/O chamber 200 and the I/F 100. The I/O chamber 200 is provided with a vacuum pump 210 and a gas supply system 220. The vacuum pump 210 evacuates the I/O chamber 200. The gas supply system 220 supplies a vent gas into the I/O chamber 200 when the I/O chamber 200 is to be brought to an atmospheric pressure.

The R chamber 300 includes a vacuum pump 310, an alignment chamber (ALN chamber) 320, a grounding body chamber (H chamber) 330, and a transfer robot 340. The R chamber 300 is connected to the I/O chamber 200 via the gate valve G2.

The vacuum pump 310 is connected to the R chamber 300 and evacuates the R chamber 300 to keep high vacuum.

The H chamber 330 houses a grounding body H for grounding the mask substrate W. The grounding body H covers the outer edge of the mask substrate W to suppress charges of a charged particle beam (an electron beam, for example) from accumulating on the outer edge of the mask substrate W. That is, the grounding body H functions as "eaves" for the outer edge of the mask substrate W. The grounding body H is provided also to allow charges of the electron beam accumulated on the mask substrate W to escape to the ground.

The ALN chamber 320 is a chamber for positioning (aligning) the mask substrate W. The mask substrate W is aligned in the ALN chamber 320.

The transfer robot 340 transfers the mask substrate W between the I/O chamber 200, the ALN chamber 320, the H chamber 330, and the W chamber 400.

The W chamber 400 includes a vacuum pump 410, an X-Y stage 420, and laser position measuring gauges 430A and 430B and is coupled to the R chamber 300 via the gate valve G3. The W chamber 400 can house the mask substrate W to draw a predetermined pattern on the mask substrate W with the electron beam.

The vacuum pump 410 is connected to the W chamber 400 and evacuates the W chamber 400 to keep high vacuum. The X-Y stage 420 can have the mask substrate W mounted thereon. The laser position measuring gauges 430A and 430B measure the position of the X-Y stage 420 in an X-Y plane (a substantially horizontal plane). The laser position measuring gauges 430A and 430B also measure either one or both of the positions of the mask substrate W and the grounding body H on the X-Y stage 420. The positions of the mask substrate W and the grounding body H may be measured by a laser position measuring gauge different from the laser position measuring gauges 430A and 430B. The positions of the mask substrate W and the grounding body H may alternatively be measured by a CCD (Charge-Coupled Device) camera 432 illustrated in FIG. 1B taking an image of the mask substrate W and the grounding body H mounted on the X-Y stage 420.

Grounding springs (see Eb and Ec in FIG. 4) are provided in the W chamber 400. The grounding springs are grounded and are configured to be in contact with the grounding body H when the mask substrate W is mounted on the X-Y stage 420. Accordingly, at the time of drawing, the mask substrate W is grounded via the grounding body H and the grounding springs. A resistance measuring part 40 is provided in the W chamber 400. The resistance measuring part 40 measures the resistance value of the mask substrate W via the grounding body H and the grounding springs that ground the mask substrate W in the W chamber 400.

The electron beam column (drawing part) 500 illustrated in FIG. 1B includes an electron beam irradiating unit constituted by an electron gun 510, an aperture 520, a deflector 530, lens 540 (a lighting lens (CL), a projection lens (PL), and an objective lens (OL)), and the like and irradiates the mask substrate W mounted on the X-Y stage 420 with an electron beam to draw a predetermined pattern on the mask substrate W.

The control mechanism 600 is, for example, a computer and includes an MPU (Micro Processing Unit) 601, a memory 602 (a solid state drive (SSD) or a hard disk drive (HDD), for example), and the like. The control mechanism 600 controls the operation of the drawing apparatus 10.

The arithmetic processor 700 is, for example, a computer provided separately from the control mechanism 600 and includes an MPU 701, a memory 702 (an SSD or an HDD, for example), and the like. The arithmetic processor 700 can be the same computer as the control mechanism 600. The arithmetic processor 700 receives the resistance value of the mask substrate W from the resistance measuring part 40 and performs a grounding check as to whether the mask substrate W is grounded. The grounding check will be explained in detail later.

The receiver 800 receives emergency quake information EQ obtained from the Japan Meteorological Agency or the like. The emergency quake information EQ can be one generally provided by agencies such as the Japan Meteorological Agency and companies. Alternatively, the emergency quake information EQ can be a vibration detection signal from a vibration sensor (an acceleration sensor) 50 that detects vibration of the drawing apparatus 10 itself. The vibration sensor 50 can be placed either the inside or outside the drawing apparatus 10. For example, when the emergency quake information EQ indicates vibration of a predetermined seismic intensity or higher, the control mechanism 600 automatically stops a drawing process in the W chamber 400 using the EQS function. Accordingly, deterioration in the accuracy of drawing due to earthquake vibration can be suppressed.

(Configuration of Grounding Body H)

Figure 2:
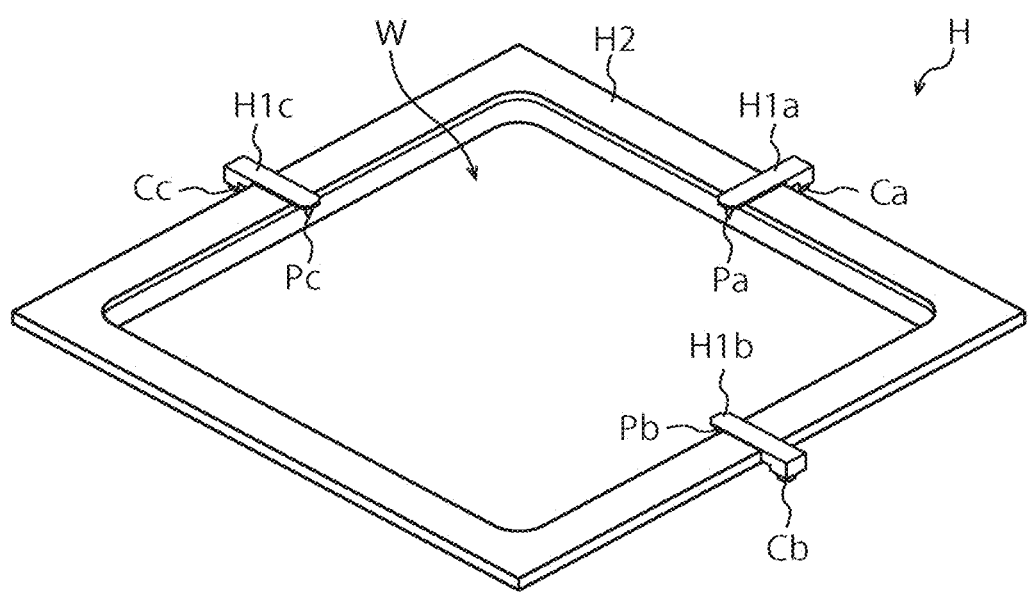
FIG. 2 is a perspective view illustrating an example of the configuration of the grounding body.
Figure 3:
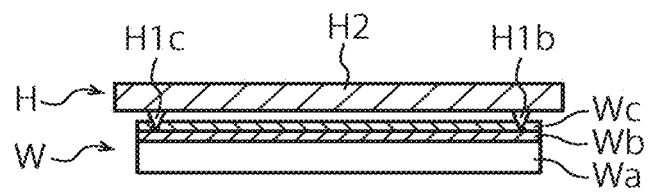
FIG. 3 is a side view of the grounding body illustrated in FIG. 2.

FIG. 2 is a perspective view illustrating an example of the configuration of the grounding body H. FIG. 3 is a side view of the grounding body H illustrated in FIG. 2 set on the mask substrate W. FIG. 3 illustrates the grounding body H in a simplified manner. As illustrated in FIG. 3, the mask substrate W has a configuration in which a light shielding film Wb (chrome (Cr), for example) and a resist film Wc are stacked on a glass substrate Wa.

As illustrated in FIG. 2, the grounding body H includes three grounding pins H1a to H1c and a frame body H2 in the form of a picture frame. For example, a conductive material such as titanium or zirconia is used for the frame body H2 and the grounding pins H1a to H1c. The grounding pins H1a to H1c are, for example, metallic members fixed to nip inner and outer peripheries of the frame body H2. The grounding pins H1a to H1c respectively have pin parts Pa to Pc pointed at a sharp angle toward the inner periphery of the frame body H2. Accordingly, when the grounding body H is set on the mask substrate W, the pin parts Pa to Pc stick through the resist film Wc formed on the base material Wa of the mask substrate W to be in contact with the light shielding film Wb as illustrated in FIG. 3. The grounding pins H1a to H1c also have connectors Ca to Cc, respectively, on the side of the outer periphery of the frame body H2. The connectors Ca to Cc are electrically connected to the pin parts Pa to Pc, respectively. The connectors Cb and Cc are provided to electrically connect the grounding pins H1b and H1c to the grounding springs.

The grounding pin H1a is electrically connected to the frame body H2 without being grounded. One of the grounding pins H1b and H1c is electrically connected to the frame body H2. The other of the grounding pins H1b and H1c is provided on the frame body H2 with an insulator interposed therebetween and is electrically separated from the frame body H2. The grounding pins H1b and H1c are grounded via the grounding springs.

As illustrated in FIG. 3, when the grounding body H is set on the mask substrate W, the grounding pins H1a to H1c of the grounding body H stick through the resist film Wc under their own weights to be in contact with the light shielding film Wb being an electrical conductor. Accordingly, the light shielding film Wb of the mask substrate W is grounded via the grounding pins H1a to H1c. Therefore, charges accumulated in the mask substrate W due to electron beam irradiation are discharged via the grounding body H. The frame body H2 of the grounding body H is grounded via the grounding pin H1a. Therefore, charges accumulated in the frame body H2 are discharged via the grounding pin H1a.

In this way, the grounding pins H1a to H1c ground the light shielding film Wb of the mask substrate W via the grounding springs in the W chamber 400. Accordingly, charges accumulated in the light shielding film Wb due to electron beam irradiation during drawing can be discharged to the ground.

(Configuration of Inner Part of W Chamber 400)

Figure 4:
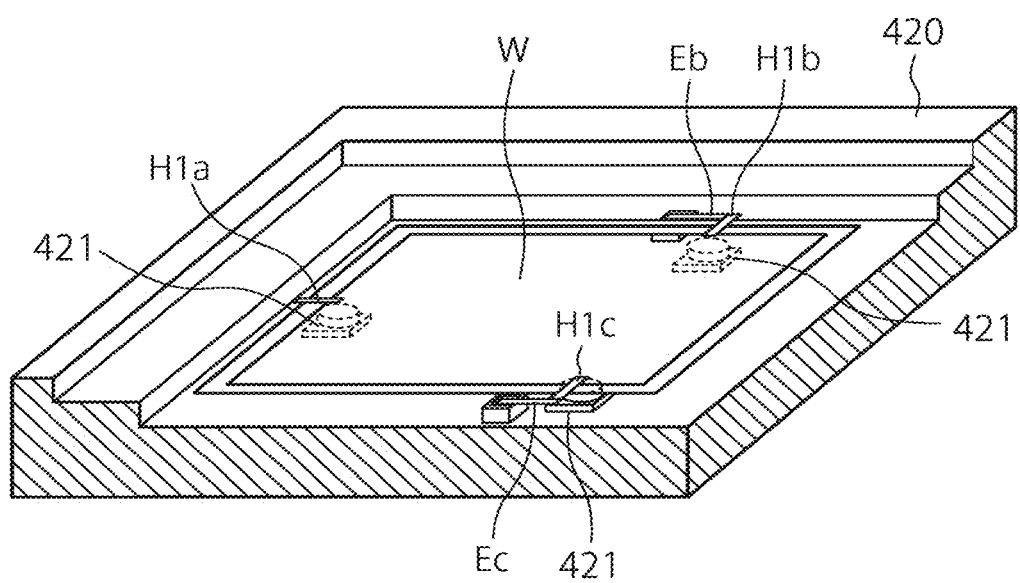
FIG. 4 is a schematic diagram of the X-Y stage placed in the chamber.

FIG. 4 is a schematic diagram of the X-Y stage 420 placed in the W chamber 400. The X-Y stage 420 in the W chamber 400 includes a plurality of mask supports 421 that support the mask substrate W, and grounding springs Eb and Ec that ground the mask substrate W. FIG. 4 illustrates a state where the mask substrate W is mounted on the X-Y stage 420. The mask supports 421 support the mask substrate W and the grounding body H mounted on the X-Y stage 420 from below. The grounding springs Eb and Ec are elastically in contact with the grounding pins H1b and H1c and ground the light shielding film Wb of the mask substrate W via the grounding pins H1b and H1c. In this way, drawing is performed in the W chamber 400 in a state where the mask substrate W is mounted on the X-Y stage 420 and is grounded via the grounding springs Eb and Ec.

(Configuration of resistance measuring part 40)

Figure 5:
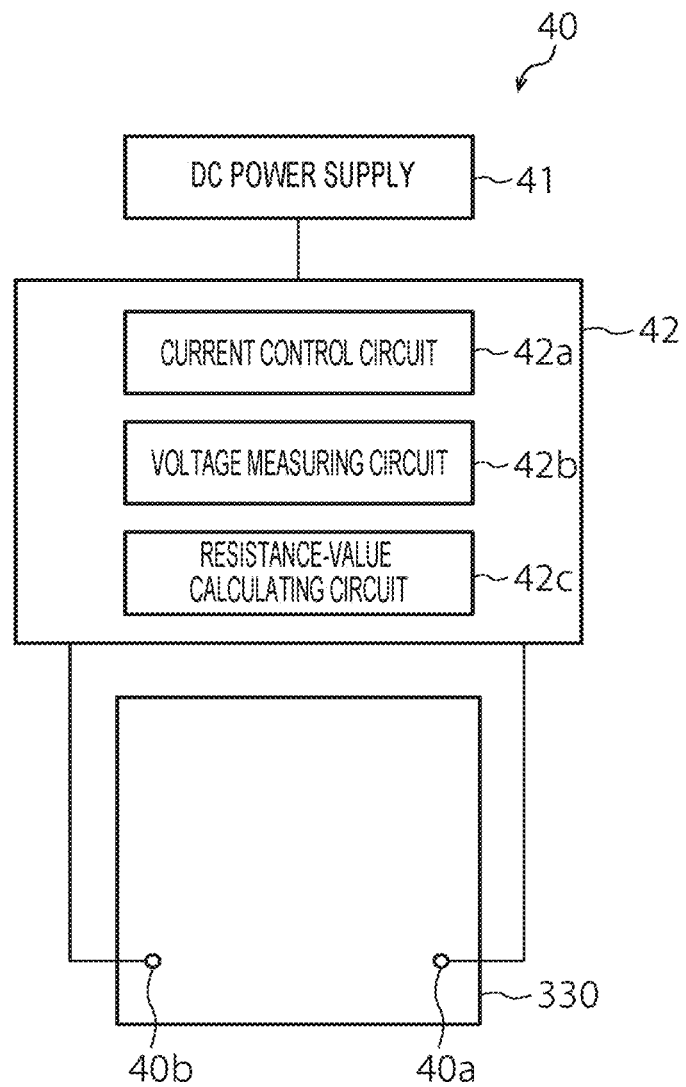
FIG. 5 is a configuration diagram of the resistance measuring part.

FIG. 5 is a configuration diagram of the resistance measuring part 40. The resistance measuring part 40 includes a DC power supply 41 placed outside the W chamber 400, and a controller 42 connected to the DC power supply 41. The controller 42 includes a current control circuit 42a, a voltage measuring circuit 42b, and a resistance-value calculating circuit 42c and measures an electrical resistance between terminals 40a and 40b. The terminals 40a and 40b are provided in the W chamber 40 and are respectively connectable to the grounding springs Eb and Ec described above.

The resistance measuring part 40 measures a contact resistance value (a resistance value) between the grounding springs Eb and Ec and the mask substrate W in a state where the grounding body H is set on the mask substrate W. Specifically, the current control circuit 42a passes a current of a certain value between the terminals 40a and 40b and the voltage measuring circuit 42b measures a voltage between the terminals 40a and 40b. The resistance-value calculating circuit 42c calculates a resistance value between the terminals 40a and 40b from the current value passing between the terminals 40a and 40b and the measured voltage value. At the time of measurement of the resistance value, the terminals 40a and 40b of the resistance measuring part 40 and the grounding springs Eb and Ec are respectively in a state of being electrically connected to each other. For example, it suffices that the resistance measuring part 40 includes a plurality of measuring pins (not illustrated) connected to the terminals 40a and 40b, respectively, and brings the measuring pins into contact with the grounding springs Eb and Ec, respectively.

As described above, the grounding pin H1b or H1c is provided on the frame body H2 with the insulator interposed therebetween. Accordingly, the current applied by the current control circuit 42a flows between the terminals 40a and 40b via the grounding springs Eb and Ec, the grounding pins H1b and H1c, and the light shielding film Wb of the mask substrate W. The contact resistance value between the terminals 40a and 40b and the grounding springs Eb and Ec is quite small and is nearly negligible. Therefore, the resistance measuring part 40 can measure, for example, the resistance value of the grounding springs Eb and Ec, the grounding pins H1b and H1c, and the light shielding film Wb of the mask substrate W between the grounding spring Eb and the grounding spring Ec.

(Measurement of Resistance Value of Mask Substrate W)

Figure 6:
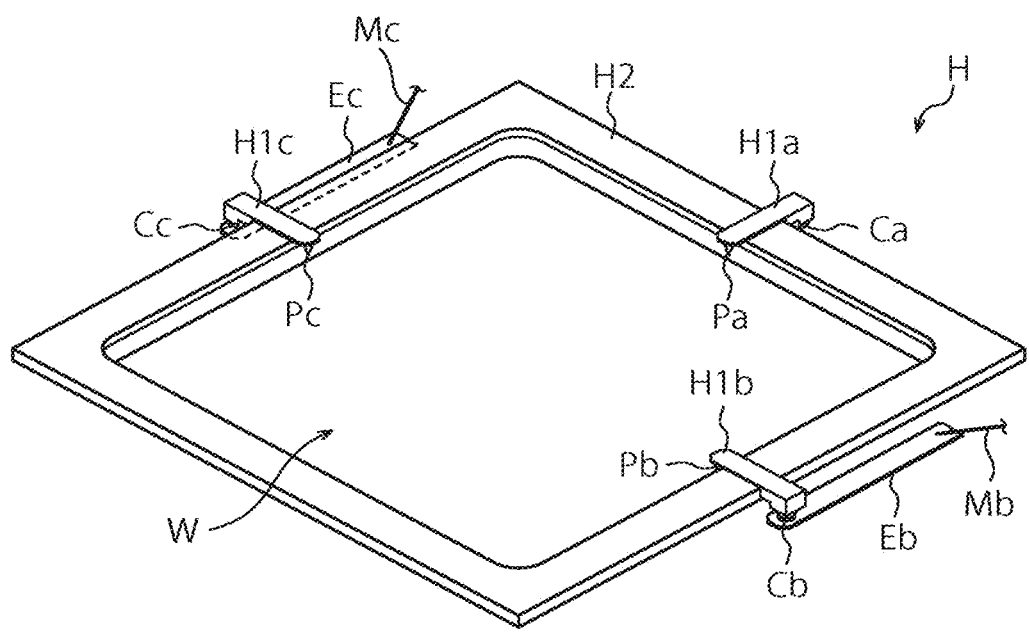
FIG. 6 is a schematic diagram illustrating a manner of measuring the resistance value of the mask substrate in the W chamber.

FIG. 6 is a schematic diagram illustrating a manner of measuring the resistance value of the mask substrate W in the W chamber 400. The resistance value of the mask substrate W is measured via the grounding springs Eb and Ec. As explained with reference to FIG. 4, for example, the grounding pins H1b and H1c are in contact with the grounding springs Eb and Ec, respectively, when the mask substrate W is mounted on the X-Y stage 420 in the W chamber 400. The connectors Cb and Cc of the grounding pins H1b and H1c are in contact with the grounding springs Eb and Ec and are brought into electrical conduction with the grounding springs Eb and Ec, respectively.

As explained with reference to FIG. 4, the light shielding film Wb of the mask substrate W is grounded via the grounding pins H1b and H1c during drawing. Meanwhile, before the drawing is performed and in a returning sequence after an emergency suspension, the resistance measuring part 40 measures the resistance value between the grounding spring Eb and the grounding spring Ec and performs a grounding check as explained with reference to FIG. 5. For example, measuring pins Mb and Mc connected to the terminals 40a and 40b of the resistance measuring part 40 are kept in contact with the grounding springs Eb and Ec.

Accordingly, the resistance measuring part 40 measures the resistance value of the light shielding film Wb of the mask substrate W via the grounding pins H1b and H1c and the grounding springs Eb and Ec. If the connector Cb or Cc is detached from the grounding spring Eb or Ec, or the grounding pin H1b or H1c is detached from the light shielding film Wb, the resistance value has an abnormal value.

(Operation of Drawing Apparatus 10)

Figure 7:
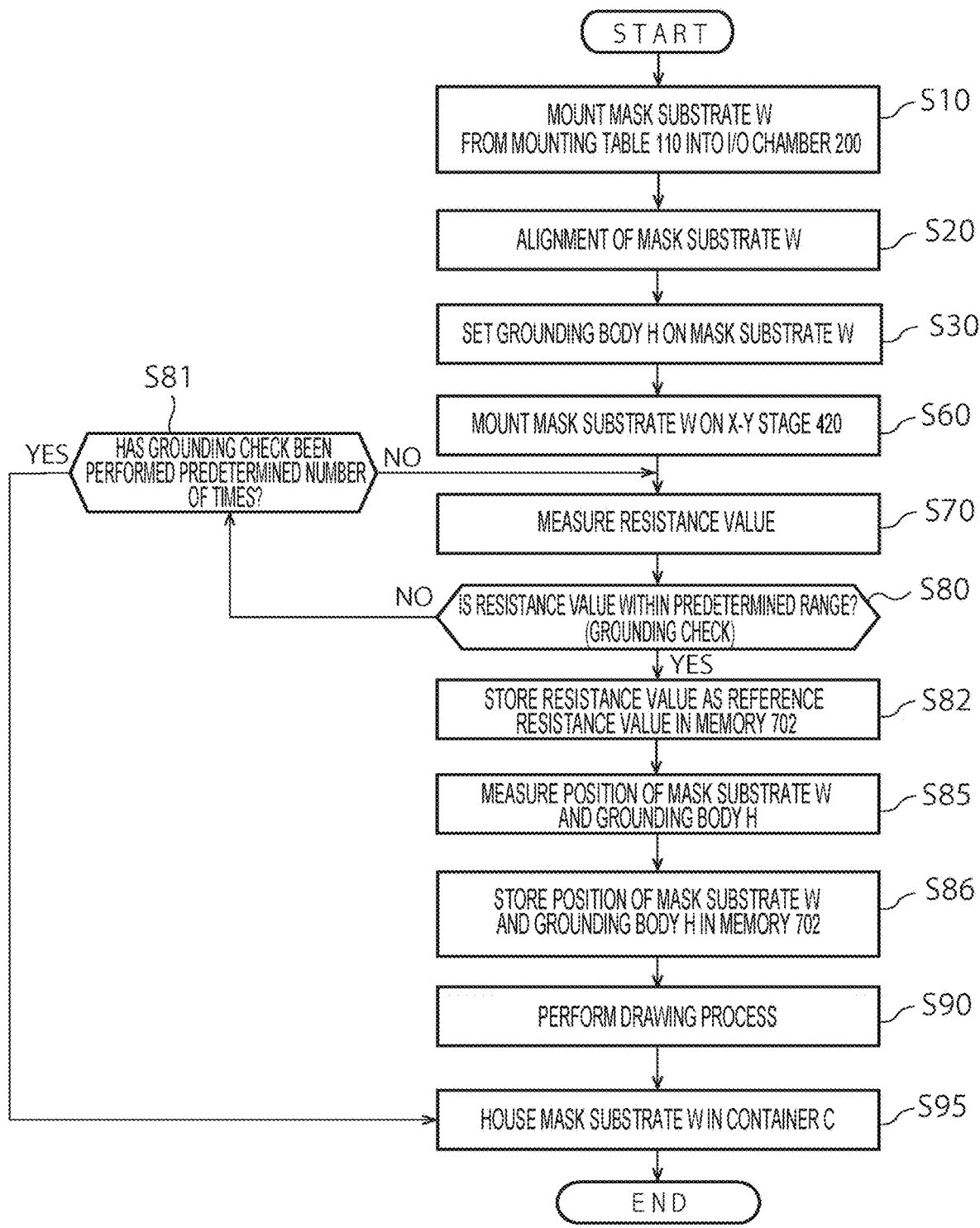
FIG. 7 is a flowchart illustrating an example of the operation of the drawing apparatus.

An operation of the drawing apparatus 10 is explained next. FIG. 7 is a flowchart illustrating an example of the operation of the drawing apparatus 10. The drawing apparatus 10 is controlled by the control mechanism 600. An abnormality in the grounding body H and the mask substrate W is determined by the arithmetic processor 700. It is assumed that the R chamber 300 and the W chamber 400 are in a vacuum state.

First, the container C housing the mask substrate W is mounted on the mounting table 110 illustrated in FIG. 1. The transfer robot 120 takes the mask substrate W out of the container C and mounts the mask substrate W in the I/O chamber 200 (Step S10). After the I/O chamber 200 is evacuated to a predetermined pressure, the transfer robot 340 takes the mask substrate W out of the I/O chamber 200 and transfers the mask substrate W to the ALN chamber 320. The ALN chamber 320 performs positioning (alignment) of the mask substrate W (Step S20). After the alignment, the transfer robot 340 transfers the mask substrate W to the H chamber 330 and sets the grounding body H mounted in the H chamber 330 on the mask substrate W (Step S30). Next, the transfer robot 340 mounts the mask substrate W on the X-Y stage 420 in the W chamber 400 (Step S60). With the mounting of the mask substrate W on the X-Y stage 420, the connectors Cb and Cc of the grounding pins H1b and H1c are brought into contact with the grounding springs Eb and Ec provided in the W chamber 400, respectively.

Next, the grounding check is performed. In the grounding check, the resistance measuring part 40 of the W chamber 400 brings the terminals 40a and 40b into contact with the grounding springs Eb and Ec, respectively, and measures the resistance value of the light shielding film Wb of the mask substrate W via the grounding springs Eb and Ec and the grounding pins H1b and H1c (Step S70). Subsequently, the MPU 701 of the arithmetic processor 700 compares the measured resistance value with a predetermined range that is previously set (Step S80).

When the resistance value is out of the predetermined range (NO at Step S80), the MPU 701 determines a grounding error. It is considered that a grounding error is caused by poor contact between the grounding springs Eb and Ec and the grounding pins H1b and H1c or between the grounding pins Hb1 and H1c and the light shielding film Wb, or the like. When a grounding error occurs, the voltage is applied again to the light shielding film Wb and the grounding check is performed again (Step S70 and NO at Steps S80 and S81). When a grounding error is determined (YES at Step S81) even after a predetermined number of times of the grounding check (Steps S70 and S80), the processing ends without performing a drawing process (Step S90). In this case, the mask substrate W is returned to the container C and a maintenance is performed as necessary (Step S95).

When the resistance value is within the predetermined range (YES at Step S80), the MPU 701 determines that the mask substrate W is normally grounded and stores the resistance value as a reference resistance value in the memory 702 (Step S82).

At the same time as the grounding check (Steps S70 and S80) is performed before start of drawing, or before or after the grounding check, the laser position measuring gauges 430A and 430B measure the position of the mask substrate W and the grounding body H mounted on the X-Y stage 420. Alternatively, the CCD camera 432 takes an image of the mask substrate W and the grounding body H mounted on the X-Y stage 420 to measure the position thereof (Step S85). In the present embodiment, the position of the mask substrate W and the grounding body H is measured after the grounding check. The position of the mask substrate W and the grounding body H measured before start of drawing is previously stored as a first reference position in the memory 702 (Step S86). The arithmetic processor 700 may determine whether the position of the mask substrate W and the grounding body H is normal in the similar manner as the grounding check. In this case, when the position of the mask substrate W and the grounding body H is determined to be normal, the position is stored as the first reference position in the memory 702 and the drawing process is performed. On the other hand, when the position of the mask substrate W and the grounding body H is determined to be abnormal, the processing can be ended without performing the drawing process (Step S90).

When the drawing process is started, the mask substrate W is irradiated with the electron beam and a desired pattern is drawn on the light shielding film Wb of the mask substrate W in the W chamber 400 (Step S90). Charges accumulated in the mask substrate W flow to the ground through the grounding pins H1b and H1c and the grounding springs Eb and Ec. Therefore, charging of the mask substrate W during the drawing can be suppressed.

When the drawing on the mask substrate W ends, the transfer robot 340 takes the mask substrate W out of the W chamber 400 and transfers the mask substrate W into the H chamber 330. The transfer robot 340 houses the grounding body H into the H chamber 330 in the opposite procedure to that of setting the grounding body H on the mask substrate W. The transfer robot 340 mounts the mask substrate W into the I/O chamber 200.

Next, the gate valve G2 is closed, a vent gas is supplied from the gas supply system 220, the inner pressure of the I/O chamber 200 is increased to the atmospheric pressure, and thereafter the gate valve G1 is opened. The transfer robot 120 takes the mask substrate W out of the I/O chamber 200 and houses the mask substrate W in the container C (Step S95). In this way, the drawing apparatus 10 performs the grounding check of the mask substrate W and performs the drawing process.

A case where the receiver 800 receives the emergency quake information EQ during drawing is explained below.

Figure 8:
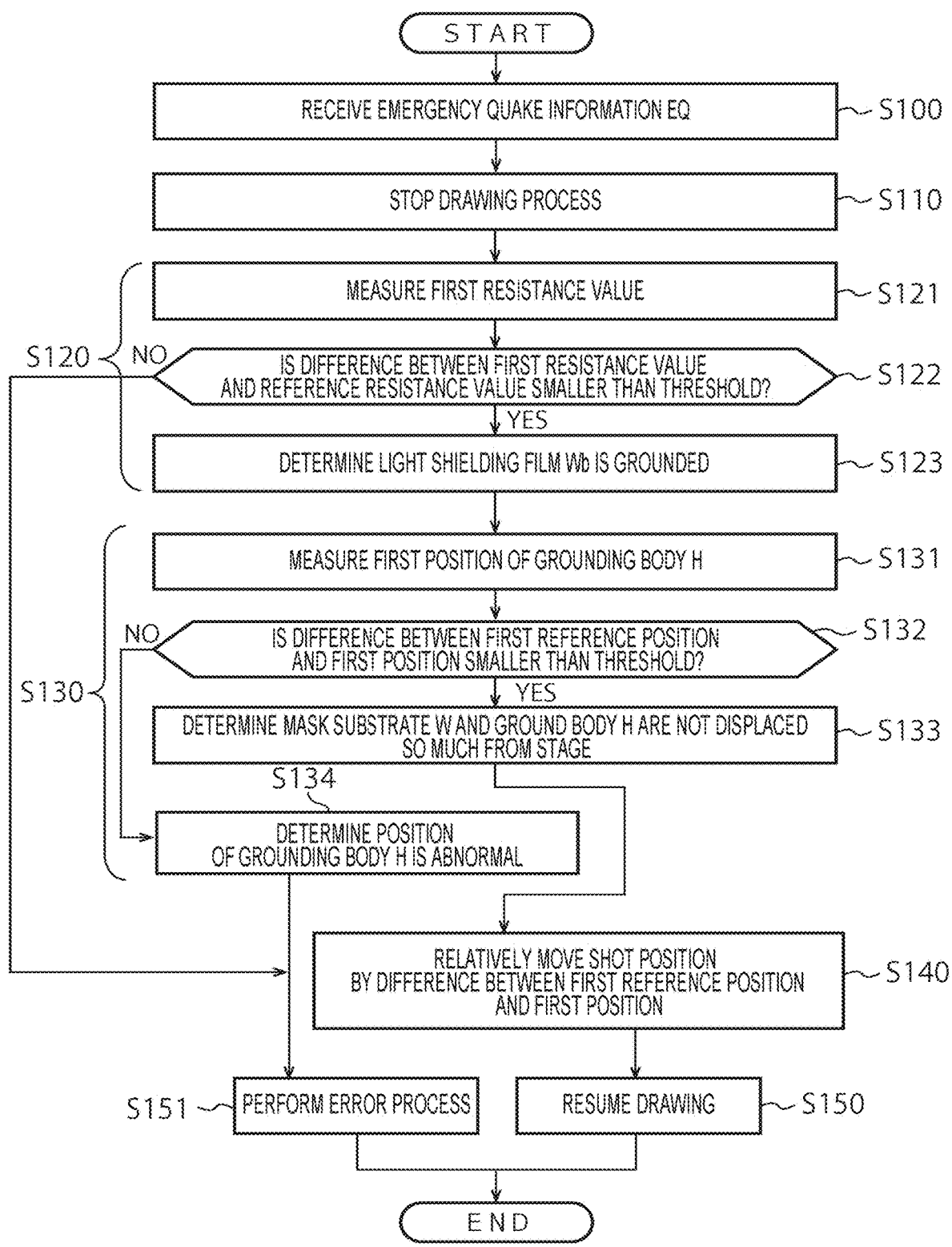
FIG. 8 is a flowchart illustrating an example of the operation of the drawing apparatus when receiving the emergency quake information.

FIG. 8 is a flowchart illustrating an example of the operation of the drawing apparatus 10 when receiving the emergency quake information EQ. When the receiver 800 receives the emergency quake information EQ during the drawing process at Step S90 (Step S100), the control mechanism 600 suspends the drawing process (Step S110). After such an emergency stop due to an earthquake, the drawing apparatus 10 performs a restoration sequence in the following manner.

First, the resistance measuring part 40 and the arithmetic processor 700 perform the grounding check again (Step S120). The operation of the grounding check is identical to the operation at Steps S70 and S80. The resistance measuring part 40 applies a voltage to the light shielding film Wb of the mask substrate W via the terminals 40a and 40b, the grounding springs Eb and Ec, and the grounding pins H1b and H1c and measures the resistance value (a first resistance value) thereof similarly to Step S70 in FIG. 7 (Step S121). The arithmetic processor 700 determines whether the light shielding film Wb of the mask substrate W is grounded on the basis of the first resistance value measured by the resistance measuring part 40 at Step S121. For example, the arithmetic processor 700 compares the first resistance value measured at Step S121 with the reference resistance value measured at Step S80 (Step S122).

When a difference between the first resistance value and the reference resistance value is equal to or larger than a preset threshold (NO at Step S122), the arithmetic processor 700 determines that the light shielding film Wb of the mask substrate W is not grounded. It suffices that the threshold for the grounding check is stored in advance in the memory 702.

The grounding check and the comparison between the first resistance value and the reference resistance value may be repeated a predetermined number of times. The arithmetic processor 700 may be configured to determined that the light shielding film Wb of the mask substrate W is not grounded when the difference between the first resistance value and the reference resistance value is still equal to or larger than the threshold even after the predetermined number of times of the grounding check and the comparison. This can reliably detect poor grounding.

When it is determined that the light shielding film Wb of the mask substrate W is not grounded, the arithmetic processor 700 transmits a signal (a resume disable signal) disabling a resume of the drawing process to the control mechanism 600. The control mechanism 600 performs an error process and ends the processing (Step S151) on the basis of the resume disable signal without resuming the drawing process (Step S90). The error process is a process of returning the mask substrate W into the container C similarly to Step S95 and displaying an error notification on an external display (not illustrated) or the like.

On the other hand, when the difference between the first resistance value and the reference resistance value is smaller than the preset threshold (YES at Step S122), the arithmetic processor 700 determines that the light shielding film Wb of the mask substrate W is grounded (Step S123). The drawing may be resumed at this stage. In the present embodiment, the arithmetic processor 700 further checks a displacement amount of the mask substrate W and the grounding body H from the stage 420 (Step S130). The check of the displacement amount is performed using the laser position measuring gauges 430A and 430B or the CCD camera 432 (see FIG. 1) serving as a first position measuring part provided in the W chamber 400.

In the check of the displacement amount, the laser position measuring gauges 430A and 430B or the CCD camera 432 measures again the position (a first position) of the mask substrate W and the ground position H (Step S131).

Next, the arithmetic processor 700 determines an abnormality in the position of the mask substrate W and the grounding body H on the basis of a difference between the first reference position of the mask substrate W and the grounding body H before the drawing and the first position of the mask substrate W and the grounding body H after the stop of the drawing process (Step S132). For example, when the difference between the first reference position and the first position is smaller than a preset threshold (YES at Step S132), the arithmetic processor 700 determines that the mask substrate W and the grounding body H are not displaced so much from the stage 420 (Step S133). In this case, the arithmetic processor 700 transmits the difference between the first reference position and the first position to the control mechanism 600 and transmits a signal (a resume enable signal) enabling a resume of the drawing process to the control mechanism 600. It suffices to set the threshold for displacement of the mask substrate W and the grounding body H within a range that is correctable by adjustment of a shot position described later and to previously store the threshold in the memory 702.

The control mechanism 600 corrects the drawing position (the shot position) on the mask substrate W by the difference between the first reference position and the first position (Step S140). For example, the control mechanism 600 can correct the difference between the first reference position and the first position by adjusting the shot position of the electron beam from the electron beam column 500 on data. Alternatively, the control mechanism 600 may correct the difference between the first reference position and the first position by position adjustment of the stage 420. This enables the electron beam column 500 to resume the drawing process from the position where the drawing process has been stopped and to maintain the drawing accuracy. The control mechanism 600 then resumes the drawing process on the basis of the resume enabling signal (Step S150). It suffices to perform the process at Step S90 and the subsequent process in FIG. 7.

On the other hand, when the difference between the first reference position and the first position is equal to or larger than the threshold (No at Step S132), the arithmetic processor 700 determines that the mask substrate W and the grounding body H are greatly displaced from the stage 420 and that the position thereof is abnormal (Step S134). In this case, the arithmetic processor 700 determines that the displacement of the mask substrate W and the grounding body H cannot be corrected by adjustment of the shot position and transmits a signal (a resume disable signal) disabling a resume of the drawing process to the control mechanism 600. The control mechanism 600 performs the error process on the basis of the resume disable signal and ends the processing (Step S151) without resuming the drawing process (Step S90).

As described above, with the drawing apparatus 10 according to the first embodiment, after the drawing process is brought to an emergency stop due to emergency quake information or the like, the resistance measuring part 40 and the arithmetic processor 700 perform a grounding check in the restoration sequence. The grounding check is performed through a comparison between a reference resistance value measured at Steps S70 and 80 before start of drawing and a first resistance value measured at Step S121 in the restoration sequence. Accordingly, the arithmetic processor 700 determines whether the resistance value measured in the restoration sequence is within a predetermined range from the reference resistance value and can confirm the grounding state of the light shielding film Wb of the mask substrate W.

Further, according to the present embodiment, the arithmetic processor 700 checks the displacement amount of the mask substrate W and the grounding body H. When the displacement amount of the mask substrate W and the grounding body H is confirmed and it is determined that the mask substrate W and the grounding body H are not greatly displaced from the original position on the stage 420 before start of the drawing, the control mechanism 600 enables a resume of the drawing process. When the mask substrate W and the grounding body H are greatly displaced from the original position on the stage 420 before start of the drawing, the control mechanism 600 does not resume the drawing process.

The control mechanism 600 corrects the shot position by the displacement amount of the mask substrate W and the grounding body H and resumes the drawing process. Accordingly, after an emergency stop, the drawing process can be resumed from a position where the processing has been stopped and the drawing accuracy can be maintained. The correction of the displacement amount of the mask substrate W and the grounding body H is accompanied by correction of the drawing position or a mechanical operation of the stage 420. Meanwhile, the grounding check can be achieved only by an electrical check. Therefore, the measurement and correction of the displacement amount of the mask substrate W and the grounding body H is preferably performed after the grounding check.

In the present embodiment, the arithmetic processor 700 performs both the grounding check and the check of the displacement amount of the grounding body H (the mask substrate W) after an emergency stop. However, the arithmetic processor 700 may perform the grounding check and omit the check of the displacement amount of the grounding body H (the mask substrate W) after an emergency stop. In this case, Step S130 in FIG. 8 is omitted and the control mechanism 600 can resume the drawing at Step S150 after grounding of the light shielding film Wb of the mask substrate W is confirmed to ensure the safety at Step S123.

Second Embodiment

Figure 9:
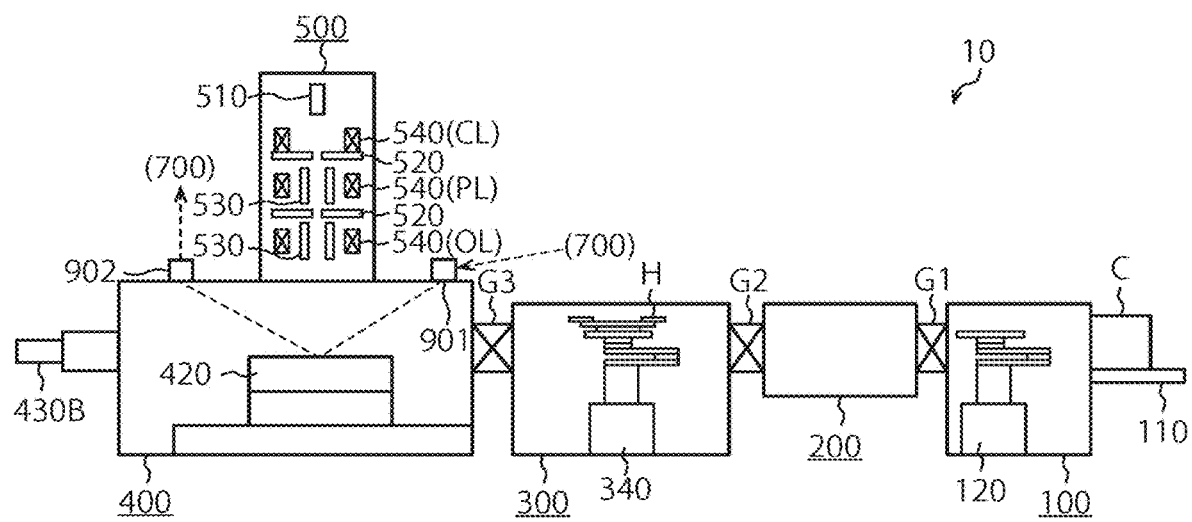
FIG. 9 is a sectional schematic diagram illustrating a configuration example of a drawing apparatus according to a second embodiment.

FIG. 9 is a sectional schematic diagram illustrating a configuration example of a drawing apparatus according to a second embodiment. The drawing apparatus 10 of the second embodiment is a drawing apparatus used to draw a phase-shifting mask (PSM). A mask substrate W for a phase-shifting mask has an alignment mark to enable plural times of the drawing processes and enhance the drawing accuracy. In the case of using the phase-shifting mask, because alignment is performed using the alignment mark on the mask substrate W, the mask substrate W can be accurately positioned and the drawing accuracy is improved.

The drawing apparatus 10 further includes an irradiator 901 and a photoreceiver 902 as a second position measuring part that measures the position of the mask substrate W using the alignment mark provided on the mask substrate W. The irradiator 901 irradiates a surface of the mask substrate W with laser light converged from obliquely above. The photoreceiver 902 receives reflection light from the mask substrate W and detects the light quantity of the reflection light. The arithmetic processor 700 instructs the irradiator 901 to irradiate with the laser light and measures the position of the alignment mark on the mask substrate W on the basis of the light quantity of the reflection light from the photoreceiver 902. The arithmetic processor 700 may alternatively measure the height of the mask substrate W using the irradiator 901 and the photoreceiver 902. Other configurations in the second embodiment can be identical to the corresponding ones in the first embodiment.

Figure 10A:
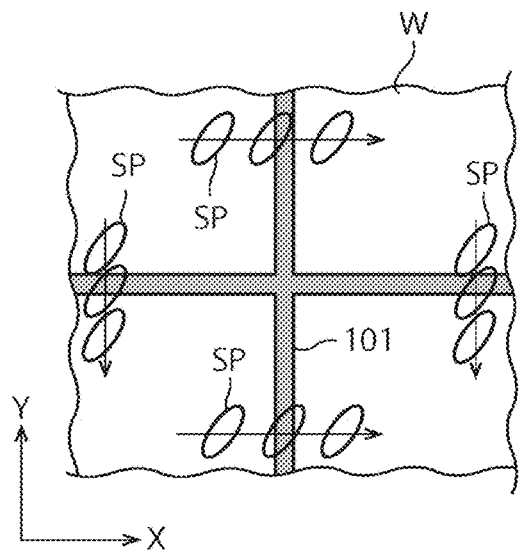
FIGS. 10A and 10B are conceptual diagrams illustrating an alignment mark and spots of the laser light from the irradiator.
Figure 10B:
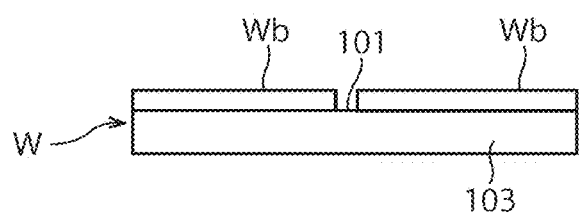

FIGS. 10A and 10B are conceptual diagrams illustrating an alignment mark and spots SP of the laser light from the irradiator 901.

As illustrated in FIG. 10A, an alignment mark 101 is formed, for example, in a cross shape with two line patterns or space patterns in the form of lines extending in X and Y directions orthogonal to each other. When the mask substrate W is mounted on the stage 420, the alignment mark 101 is substantially parallel to the X direction and the Y direction. The alignment mark 101 illustrated in FIG. 10A is provided, for example, at four corners of the mask substrate W.

As illustrated in FIG. 10B, the alignment mark 101 is formed of parts from which the light shielding film Wb is eliminated and the reflectance of light on the alignment mark 101 is lower than that on other parts. Therefore, with the photoreceiver 902 detecting the light quantity of the reflection light of the laser light, the arithmetic processor 700 can distinguish the alignment mark 101 from other regions of the mask substrate W.

Figure 11:
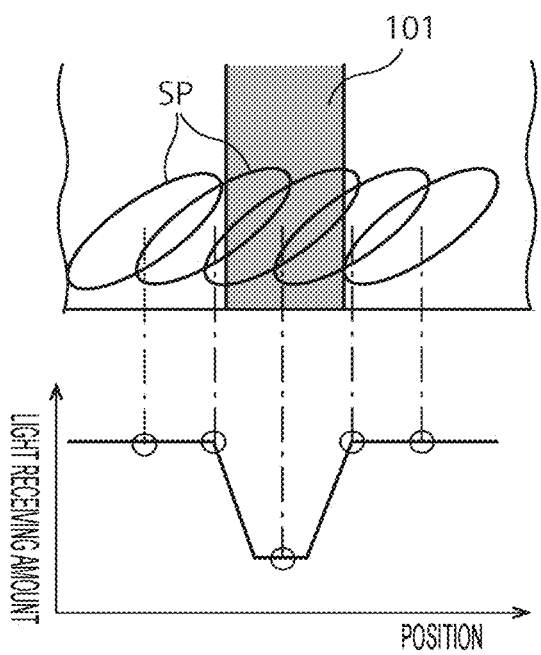
FIG. 11 is a diagram illustrating a manner in which the alignment mark is scanned with the spots of laser light.

FIG. 11 is a diagram illustrating a manner in which the alignment mark is scanned with the spots SP of laser light. The mask substrate W is scanned with the laser light from the irradiator 901 while the stage 420 is moved. When a spot SP of the laser light gradually approaches the alignment mark 101, the light quantity of the reflection light detected by the photoreceiver 902 decreases. This enables the arithmetic processor 700 to accurately measure the position of the alignment mark 101.

Figure 12:
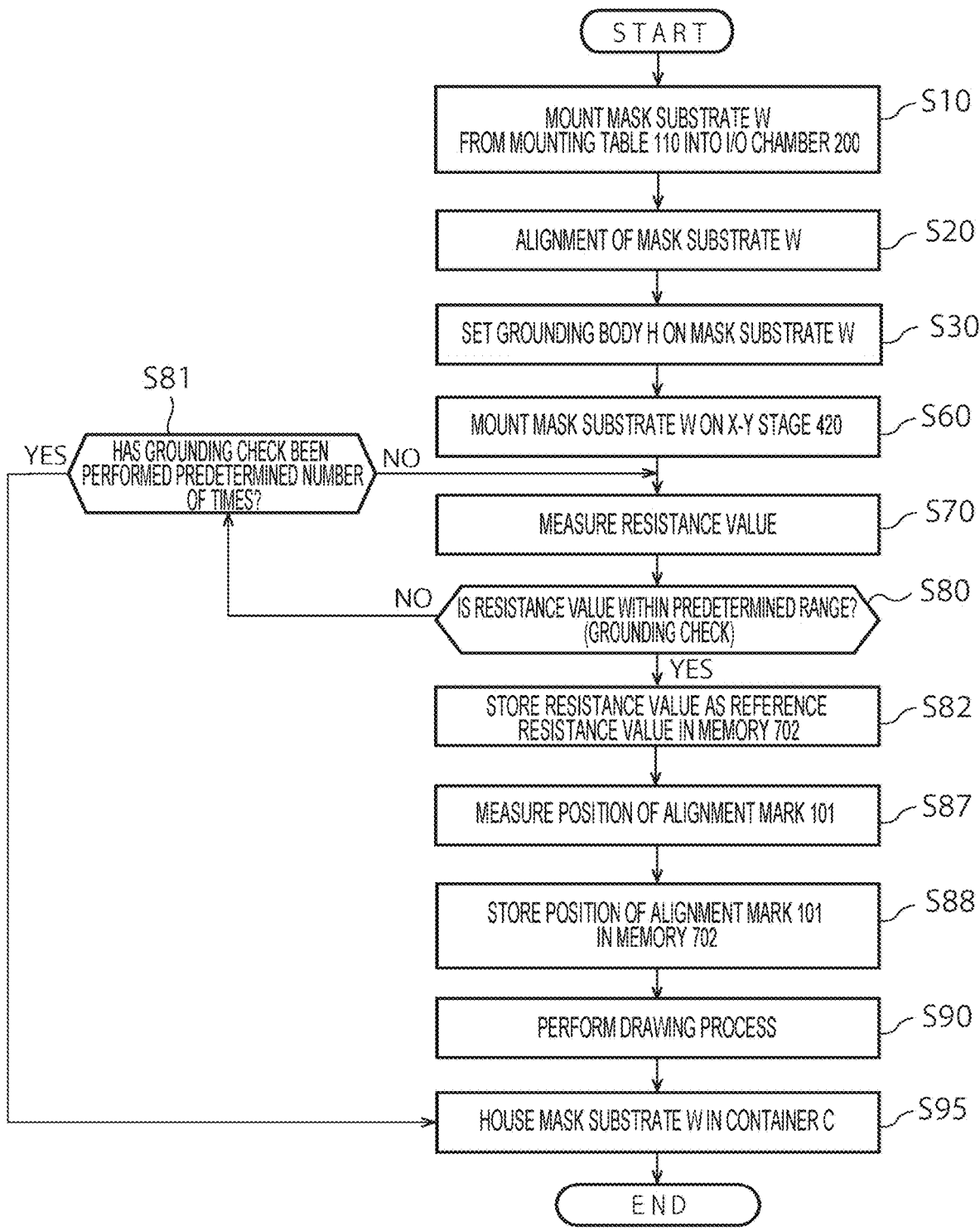
FIG. 12 is a flowchart illustrating an example of the operation of the drawing apparatus according to the second embodiment.

FIG. 12 is a flowchart illustrating an example of the operation of the drawing apparatus 10 according to the second embodiment. The basic operation of the drawing process according to the second embodiment is identical to that illustrated in FIG. 7. In the second embodiment, however, at the same time as the grounding check (Steps S70 and S80) is performed before start of drawing, or before or after the grounding check, the irradiator 901 and the photoreceiver 902 previously measure the position of the alignment mark 101 (Step S87). In the second embodiment, the position of the alignment mark 101 is measured after the grounding check. The position of the alignment mark 101 measured before start of drawing is previously stored as a second reference position in the memory 702 (Step S88). Processes such as the drawing process at Step S90 and the subsequent step are performed thereafter.

A case where the receiver 800 receives the emergency quake information EQ during drawing is explained.

Figure 13:
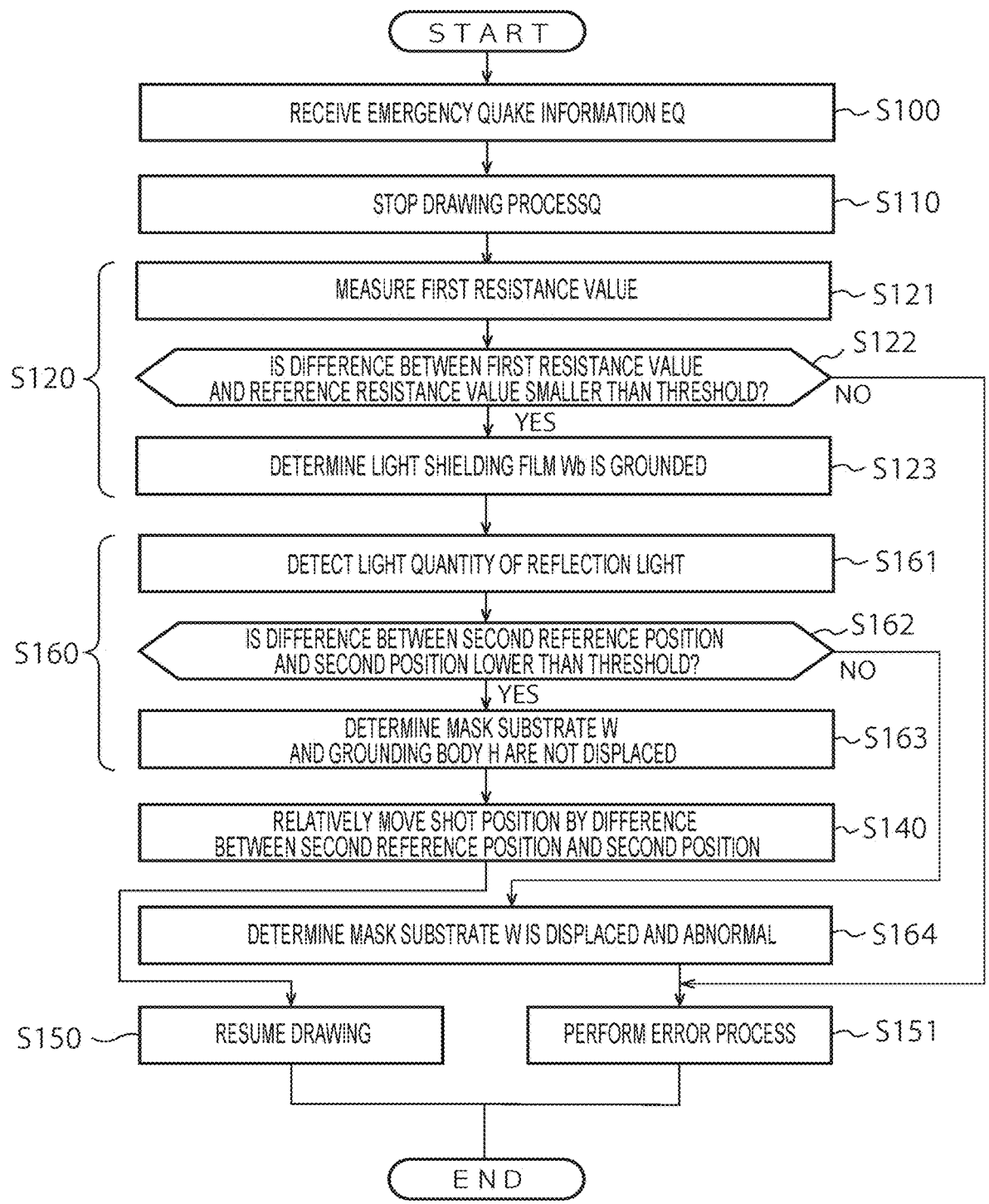
FIG. 13 is a flowchart illustrating an example of the operation of the drawing apparatus according to the second embodiment when the emergency quake information is received.

FIG. 13 is a flowchart illustrating an example of the operation of the drawing apparatus 10 according to the second embodiment when the emergency quake information EQ is received. When the receiver 800 receives the emergency quake information EQ during the drawing process at Step S90 (Step S100), the control mechanism 600 stops the W chamber 400 and the electron beam column 500 to stop the drawing process (Step S110). After such an emergency stop due to an earthquake, the drawing apparatus 10 performs a restoration sequence in a manner described below.

First, the resistance measuring part 40 and the arithmetic processor 700 perform the grounding check again (Step S120). The operation of the grounding check is identical to that at Step S120 in FIG. 8. The operation performed when it is determined that the light shielding film Wb of the mask substrate W is not grounded can be identical to that (the operation in the case of NO at Step S122 in FIG. 8) in the first embodiment.

On the other hand, when it is determined that the light shielding film Wb of the mask substrate W is grounded (Step S123), the arithmetic processor 700 further checks the position of the alignment mark 101 (Step S160). In the check of the position of the alignment mark 101, the alignment mark 101 is first detected based on the light quantity of the reflection light detected by the photoreceiver 902 (Step S161) as described above.

Next, the arithmetic processor 700 compares a position (a second position) of the alignment mark 101 detected after the emergency stop with the second reference position and determines an abnormality of the position of the mask substrate W on the basis of a difference between the second reference position and the second position (Step S162). For example, when the difference between the second reference position and the second position is smaller than a preset threshold (YES at Step S162), the arithmetic processor 700 determines that the mask substrate W and the grounding body H are not displaced so much from the stage 420 (Step S163). In this case, the arithmetic processor 700 transmits the difference between the second reference position and the second position to the control mechanism 600 and transmits a signal (a resume enable signal) enabling a resume of the drawing process to the control mechanism 600.

The control mechanism 600 corrects the shot position by the difference between the second reference position and the second position. The correction of the shot position can be performed in an identical manner to that in Step S140. Thereafter, the control mechanism 600 resumes the drawing process on the basis of the resume enable signal for the drawing process similarly to Step S150.

On the other hand, when the difference between the second reference position and the second position is equal to or larger than the threshold (NO at Step S162), the arithmetic processor 700 determines that the mask substrate W is displaced and that the position of the mask substrate W is abnormal (Step S164). In this case, the arithmetic processor 700 transmits a signal (a resume disable signal) disabling a resume of the drawing process to the control mechanism 600. The control mechanism 600 performs the error process and ends the processing similarly to Step S151 without resuming the drawing process (Step S90). The error process is a process of returning the mask substrate W into the container C and displaying an error notification on an external display or the like, similarly to Step S95.

As described above, when a phase-shifting mask is to be drawn, the drawing apparatus 10 can check the position of the mask substrate W using the alignment mark 101 in a restoration sequence. The check of the position is performed by comparing the second position of the alignment mark 101 measured after an emergency stop with the second reference position measured before start of drawing. Accordingly, the arithmetic processor 700 can determine the position of the alignment mark 101 measured in the restoration sequence and confirm whether the mask substrate W can be drawn. Other configurations and operations in the second embodiment are identical to those in the first embodiment. Accordingly, the second embodiment can obtain effects identical to those in the first embodiment.

Third Embodiment

Figure 14:
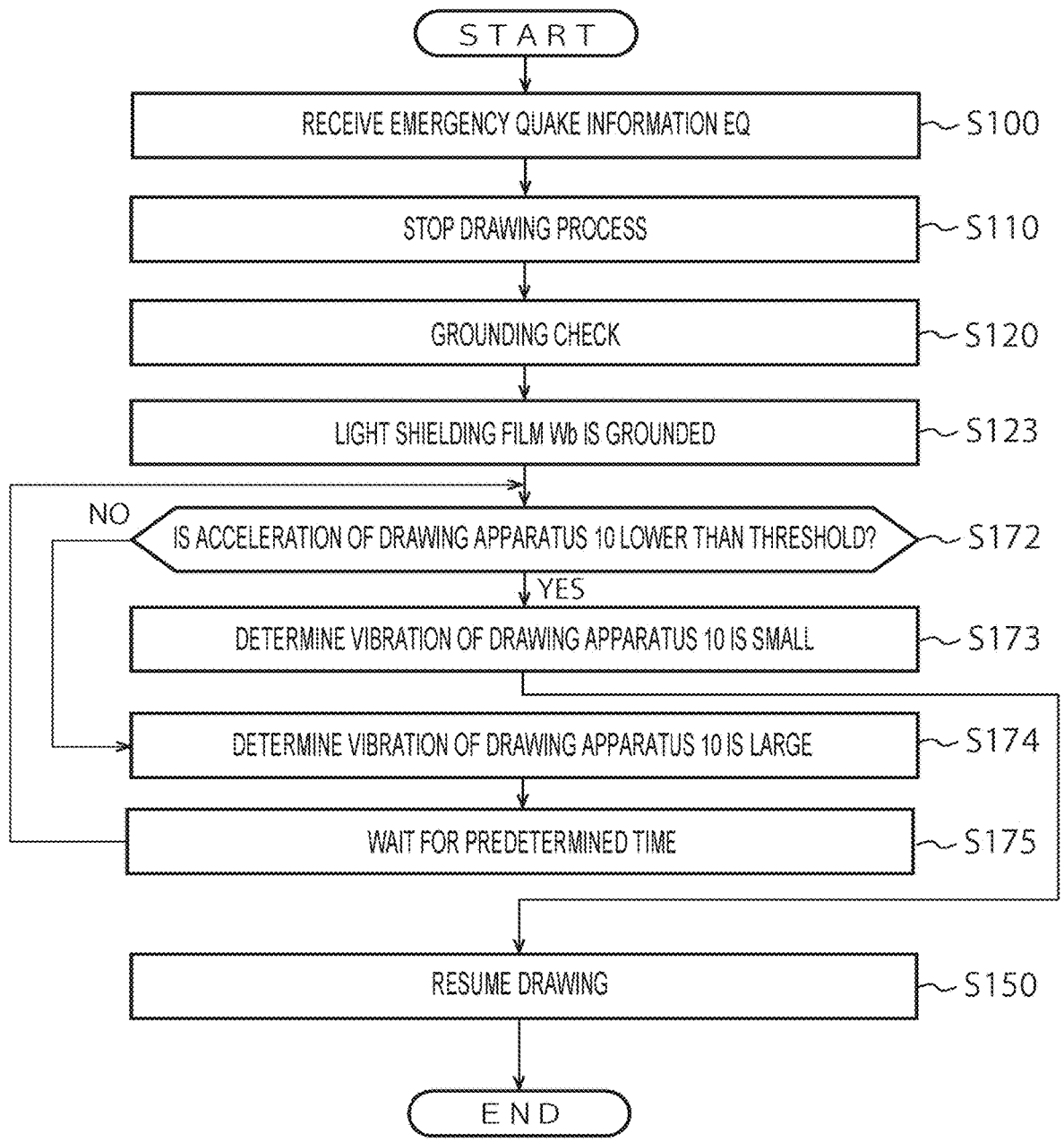
FIG. 14 is a flowchart illustrating an example of the operation of a drawing apparatus according to a third embodiment.

FIG. 14 is a flowchart illustrating an example of the operation of a drawing apparatus according to a third embodiment. The drawing apparatus according to the third embodiment can be the same as that illustrated in FIG. 1. Accordingly, detailed descriptions of the configurations of the third embodiment are omitted.

In the first and second embodiments, the error process is performed when the arithmetic processor 700 determines that the drawing process cannot be resumed. However, the drawing process may be resumed by a lapse of time depending on items of the restoration sequence. For example, there is a case where the acceleration sensor 50 is provided as a vibration sensor that is capable of detecting vibration in the drawing apparatus 10 as illustrated in FIG. 1. The arithmetic processor 700 according to the third embodiment determines whether to enable a resume of the drawing process on the basis of the acceleration from the acceleration sensor 50. The vibration sensor is not limited to the acceleration sensor 50 and examples of vibration to be detected include the seismic intensity as well as the acceleration.

For example, when it is determined that the light shielding film Wb of the mask substrate W is grounded (Step S123) after performing the processes at Step S100 to S120, the arithmetic processor 700 determines whether to enable a resume of the drawing process on the basis of the acceleration of the drawing apparatus 10 or the chamber 400 (Step S172). When the acceleration measured by the acceleration sensor 50 is lower than a preset threshold (YES at Step S172), the arithmetic processor 700 determines that vibration of the drawing apparatus 10 caused by an earthquake is small (Step S173). In this case, the arithmetic processor 700 transmits a resume enable signal to the control mechanism 600 (Step S150).

On the other hand, when the acceleration measured by the acceleration sensor 50 is equal to or higher than the threshold (NO at Step S172), the arithmetic processor 700 determines that vibration of the drawing apparatus 10 caused by the earthquake is still large (Step S174). In this case, the arithmetic processor 700 transmits a resume disable signal to the control mechanism 600 and waits for a predetermined time (Step S175).

When the predetermined time passes after the determination at Step S174, the arithmetic processor 700 measures again vibration using the acceleration sensor 50. When the acceleration is then lower than the preset threshold (YES at Step S172), the arithmetic processor 700 transmits a signal enabling a resume of the drawing process to the control mechanism 600.

When the acceleration measured by the acceleration sensor 50 is equal to or higher than the threshold (NO at Step S172), the arithmetic processor 700 repeats the process at Step S175. Accordingly, when the item of the restoration sequence is the acceleration measured by the acceleration sensor 50, the arithmetic processor 700 waits until the vibration of the drawing apparatus 10 subsides. When the vibration of the drawing apparatus 10 subsides, the arithmetic processor 700 transmits a signal enabling a resume of the drawing process to the control mechanism 600.

Other configurations and operations in the third embodiment are identical to those in the first and second embodiments. Therefore, the grounding check, the check of position displacement of the grounding body H, or the check of the alignment mark 101 can be performed along with the check of the acceleration.

In this way, according to the third embodiment, check items (the acceleration, for example) recovered with a lapse of time are distinguished from other check items (the grounding check, for example) and the arithmetic processor 700 waits for a predetermined time when the check items that can be recovered with a lapse of time have an error. Accordingly, useless execution of the error process (Step S151) can be avoided.

At least a part of the drawing apparatus according to the embodiments can be configured by hardware or software. When it is configured by software, a program that realizes at least some of functions of a drawing method can be stored in a recording medium such as a flexible disk or a CD-ROM and be loaded into a computer to be executed thereon. The recording medium is not limited to a removable medium such as a magnetic disk or an optical disk and can be a fixed recording medium such as a hard disk drive or a memory. A program that realizes at least some of the functions of the drawing method can be distributed via a communication line (including a wireless communication) such as the Internet. Further, the program can be distributed via a wired line or a wireless line such as the Internet or by being stored in a recorded medium in an encrypted, modulated, or compressed state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A drawing apparatus comprising:
a chamber configured to house a processing target;
a drawing part configured to draw a predetermined pattern on the processing target with a charged particle beam;
a resistance measuring part configured to measure a resistance value of the processing target via a grounding member grounding the processing target in the chamber;
a receiver configured to receive earthquake information;
a controller configured to stop a drawing process in the chamber when the receiver receives the earthquake information; and
an arithmetic processor configured to determine whether the processing target is grounded on a basis of the resistance value from the resistance measuring part, wherein
the controller starts the drawing process after the arithmetic processor determines that the processing target is grounded, and
the controller resumes the drawing process when the arithmetic processor determines that the processing target is grounded or does not resume the drawing process when the arithmetic processor determines that the processing target is not grounded after the drawing process is stopped due to the earthquake information.

2. The apparatus of claim 1, wherein the arithmetic processor determines whether the processing target is grounded on a basis of a difference between a reference resistance value of the processing target measured before drawing and a first resistance value measured after the drawing process is stopped.

3. The apparatus of claim 2, further comprising a second position measuring part configured to measure a position of the processing target using an alignment mark provided on the processing target, wherein
the arithmetic processor determines an abnormality of the position of the processing target on a basis of a difference between a second reference position of the alignment mark measured before drawing and a second position of the alignment mark measured after the drawing process is stopped.

4. The apparatus of claim 2, further comprising a vibration sensor configured to detect an acceleration of the drawing apparatus, wherein
the arithmetic processor transmits a signal disabling a resume of the drawing process to the controller when the acceleration is equal to or higher than a threshold, and transmits a signal enabling a resume of the drawing process to the controller when the acceleration remeasured after a lapse of a predetermined time is lower than the threshold.

5. The apparatus of claim 1, further comprising a first position measuring part configured to measure a position of the grounding member in the chamber, wherein
the arithmetic processor determines an abnormality of the position of the grounding member on a basis of a difference between a first reference position of the grounding member measured before drawing and a first position of the grounding member measured after the drawing process is stopped.

6. The apparatus of claim 5, wherein the controller moves a drawing position on the processing target by the difference between the first reference position and the first position.

7. The apparatus of claim 6, further comprising a vibration sensor configured to detect an acceleration of the drawing apparatus, wherein
the arithmetic processor transmits a signal disabling a resume of the drawing process to the controller when the acceleration is equal to or higher than a threshold, and transmits a signal enabling a resume of the drawing process to the controller when the acceleration remeasured after a lapse of a predetermined time is lower than the threshold.

8. The apparatus of claim 5, further comprising a second position measuring part configured to measure a position of the processing target using an alignment mark provided on the processing target, wherein
the arithmetic processor determines an abnormality of the position of the processing target on a basis of a difference between a second reference position of the alignment mark measured before drawing and a second position of the alignment mark measured after the drawing process is stopped.

9. The apparatus of claim 5, further comprising a vibration sensor configured to detect an acceleration of the drawing apparatus, wherein
the arithmetic processor transmits a signal disabling a resume of the drawing process to the controller when the acceleration is equal to or higher than a threshold, and transmits a signal enabling a resume of the drawing process to the controller when the acceleration remeasured after a lapse of a predetermined time is lower than the threshold.

10. The apparatus of claim 1, further comprising a second position measuring part configured to measure a position of the processing target using an alignment mark provided on the processing target, wherein
the arithmetic processor determines an abnormality of the position of the processing target on a basis of a difference between a second reference position of the alignment mark measured before drawing and a second position of the alignment mark measured after the drawing process is stopped.

11. The apparatus of claim 1, further comprising a vibration sensor configured to detect an acceleration of the drawing apparatus, wherein
the arithmetic processor transmits a signal disabling a resume of the drawing process to the controller when the acceleration is equal to or higher than a threshold, and transmits a signal enabling a resume of the drawing process to the controller when the acceleration remeasured after a lapse of a predetermined time is lower than the threshold.

12. A drawing method using a drawing apparatus comprising a drawing part configured to draw a predetermined pattern on a processing target with a charged particle beam, a resistance measuring part configured to measure a resistance value of the processing target via a grounding member grounding the processing target, a receiver configured to receive earthquake information, a controller configured to control a drawing process of the processing target, and an arithmetic processor configured to determine whether the processing target is grounded, the method comprising:

starting the drawing process after the arithmetic processor determines that the processing target is grounded;

stopping the drawing process when the earthquake information is received during the drawing process;

measuring a resistance value of the processing target after the drawing process is stopped;

determining whether the processing target is grounded on a basis of the resistance value; and resuming the drawing process by the controller when it is determined that the processing target is grounded or not resuming the drawing process when the arithmetic processor determines that the processing target is not grounded.

13. The method of claim 12, wherein the determining of a grounding state of the processing target is performed on a basis of a difference between a reference resistance value of the processing target measured before drawing and a first resistance value measured after the drawing process is stopped.

14. The method of claim 12, wherein
the drawing apparatus further comprises a first position measuring part configured to measure a position of the grounding member,
the method further comprising:
measuring a position of the grounding member before drawing as a first reference position;
measuring a position of the grounding member after the drawing process is stopped as a first position; and
determining an abnormality of the position of the grounding member on a basis of a difference between the first reference position and the first position.

15. The method of claim 14, wherein the controller moves a drawing position on the processing target by the difference between the first reference position and the first position.

16. The method of claim 12, wherein
the drawing apparatus further comprises a second position measuring part configured to measure a position of the processing target using an alignment mark provided on the processing target,
the method further comprising:
measuring a position of the alignment mark before drawing as a second reference position;
measuring a position of the alignment mark after the drawing process is stopped as a second position; and
determining an abnormality of the position of the processing target on a basis of a difference between the second reference position and the second position.

17. The method of claim 12, wherein
the drawing apparatus further comprises a vibration sensor configured to detect an acceleration of the drawing apparatus,
the method further comprising:
measuring an acceleration of the drawing apparatus;
transmitting a signal disabling a resume of the drawing process to the controller when the acceleration is equal to or higher than a threshold;
remeasuring an acceleration of the drawing apparatus after a lapse of a predetermined time; and
transmitting a signal enabling a resume of the drawing process to the controller when the acceleration having been remeasured is lower than the threshold.

* * * * *